(12) United States Patent
Feichtinger et al.

(10) Patent No.: US 10,714,458 B2
(45) Date of Patent: Jul. 14, 2020

(54) MULTI-LED SYSTEM

(71) Applicant: TDK Electronics AG, München (DE)

(72) Inventors: Thomas Feichtinger, Graz (AT); Franz Rinner, Deutschlandsberg (AT)

(73) Assignee: TDK Electronics AG, München (DE)

( * ) Notice: Subject to any disclaimer, the term of this patent is extended or adjusted under 35 U.S.C. 154(b) by 0 days.

(21) Appl. No.: 16/099,126

(22) PCT Filed: Mar. 30, 2017

(86) PCT No.: PCT/EP2017/057600
§ 371 (c)(1),
(2) Date: Nov. 5, 2018

(87) PCT Pub. No.: WO2017/190895
PCT Pub. Date: Nov. 9, 2017

(65) Prior Publication Data
US 2019/0148346 A1    May 16, 2019

(30) Foreign Application Priority Data
May 6, 2016    (DE) .......... 10 2016 108 427

(51) Int. Cl.
*H05K 1/00* (2006.01)
*H01L 25/075* (2006.01)
(Continued)

(52) U.S. Cl.
CPC ........ *H01L 25/0753* (2013.01); *H01L 25/167* (2013.01); *H05K 1/0206* (2013.01); *H05K 1/0259* (2013.01); *H05K 1/181* (2013.01); *H05K 1/185* (2013.01); *H05K 2201/10106* (2013.01); *H05K 2201/10151* (2013.01); *H05K 2201/10174* (2013.01)

(58) Field of Classification Search
CPC . H01L 25/0753; H01L 25/167; H05K 1/0206; H05K 1/0259; H05K 1/181; H05K 1/185; H05K 2201/10106; H05K 2201/10151; H05K 2201/1017
See application file for complete search history.

(56) References Cited

U.S. PATENT DOCUMENTS 6,201,300 B1 * 3/2001 Tseng ............... H01L 23/36
174/16.3
7,273,987 B2 * 9/2007 Becker ............... H05K 1/021
174/260
(Continued)

FOREIGN PATENT DOCUMENTS

DE 10 2012 104 494 A1   11/2013
DE 10 2014 101 092 A1    7/2015
(Continued)

OTHER PUBLICATIONS

JP 2005-150490 A English Translation (Year: 2005).*
(Continued)

*Primary Examiner* — Pete T Lee
(74) *Attorney, Agent, or Firm* — DLA Piper LLP (US)

(57) ABSTRACT

A multi-LED system includes a carrier; and a plurality of light-emitting diodes arranged on the carrier, wherein the carrier has a main body, and a plurality of electrical components are embedded in the main body.

18 Claims, 3 Drawing Sheets

(51) Int. Cl.
*H05K 1/02* (2006.01)
*H05K 1/18* (2006.01)
*H01L 25/16* (2006.01)

(56) References Cited

U.S. PATENT DOCUMENTS

| | | | |
|---|---|---|---|
| 7,842,960 B2* | 11/2010 | Reginelli | H01L 25/0753 257/98 |
| 8,502,204 B2* | 8/2013 | Eissler | H01S 5/0261 257/40 |
| 9,119,321 B2* | 8/2015 | Chikara | H01G 2/065 |
| 9,627,598 B2* | 4/2017 | Miyoshi | H01L 33/502 |
| 10,014,459 B2 | 7/2018 | Feichtinger et al. | |
| 2006/0232373 A1 | 10/2006 | Kanazawa et al. | |
| 2011/0108860 A1* | 5/2011 | Eissler | H01S 5/0261 257/88 |
| 2011/0141638 A1 | 6/2011 | Hoshikawa et al. | |
| 2012/0168206 A1* | 7/2012 | Sekine | H01L 21/486 174/252 |
| 2013/0062633 A1* | 3/2013 | Demuynck | H01L 25/0753 257/88 |
| 2014/0301054 A1* | 10/2014 | Nagai | H01L 33/62 361/761 |
| 2015/0144983 A1 | 5/2015 | Feichtinger et al. | |
| 2015/0243865 A1 | 8/2015 | Feichtinger et al. | |
| 2017/0011827 A1 | 1/2017 | Miyauchi et al. | |
| 2018/0070436 A1 | 3/2018 | Feichtinger et al. | |

FOREIGN PATENT DOCUMENTS

| | | |
|---|---|---|
| DE | 10 2014 112 673 A1 | 3/2016 |
| DE | 10 2015 104 641 A1 | 9/2016 |
| EP | 2 790 235 A1 | 10/2014 |
| JP | 2008-084943 A | 4/2008 |
| JP | 2009-177098 A | 8/2009 |
| JP | 2012-209537 A | 10/2012 |

OTHER PUBLICATIONS

Nishino (JP 2005-150490 A English translation) (Year: 2005).*
Notice of Reasons for Refusal dated Jan. 14, 2020, of counterpart Japanese Application No. 2018-558159, along with an English translation.

* cited by examiner

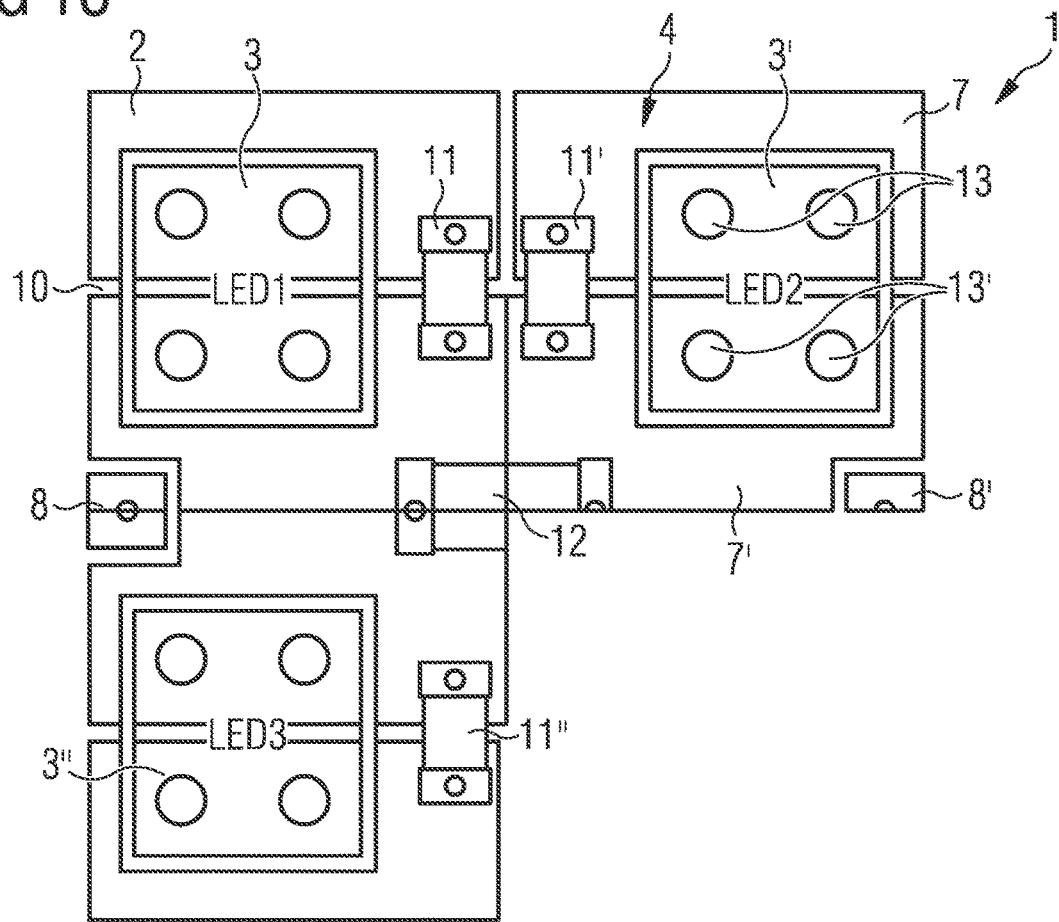
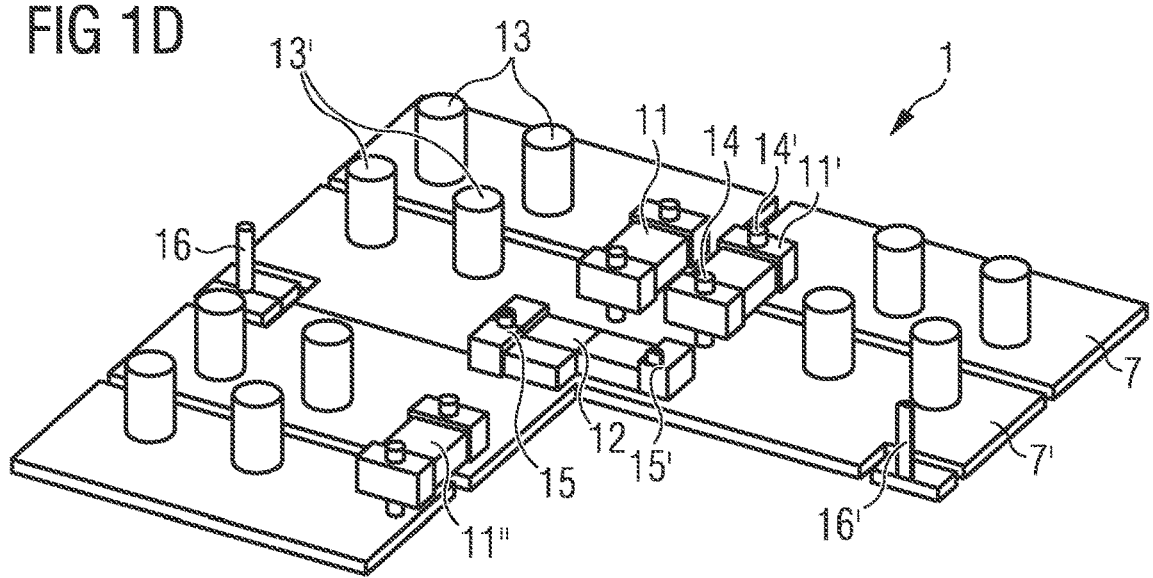

MULTI-LED SYSTEM

TECHNICAL FIELD

This disclosure relates to a multi-LED system designed, for example, to produce a flash, and useful, in particular, for mobile applications such as smartphones or digital cameras.

BACKGROUND

Multi-LED systems having a hybrid design made of a substrate, an assembly of passive components and a plurality of light-emitting diodes (LEDs) are known. The LEDs are covered, for example, by light-conversion layers such that, for example, a combination of warm-white light and cold-white light is produced.

For the purposes of protecting the LEDs from electrostatic discharges (ESDs), use can be made of discrete components having a varistor function, although these lead to a larger installation size. DE 10 2014 101 092 A1 discloses a chip having a varistor function, on which chip an LED can be mounted.

There is nonetheless a need to provide a multi-LED system having improved properties.

SUMMARY

We provide a multi-LED system including a carrier; and a plurality of light-emitting diodes arranged on the carrier, wherein the carrier has a main body, and a plurality of electrical components are embedded in the main body.

We also provide a carrier for a multi-LED system including a carrier designed for arrangement of a plurality of LEDs and having a main body having a resin material and/or polymer material, wherein a plurality of ESD protection components and at least one temperature sensor are embedded in the main body.

We further provide an LED system, including a carrier; and one or more light-emitting diodes arranged on the carrier, wherein the carrier has a main body, one or more electrical components are embedded in the main body, the carrier has at least one upper metallization for the connection of at least one of the embedded components and at least one lower metallization for the connection of the embedded component, the upper metallization is arranged on a top side and the lower metallization is arranged on a bottom side of the main body, the embedded component connects to the upper metallization by a via, and the upper metallization connects to the lower metallization by a via.

BRIEF DESCRIPTION OF THE DRAWINGS

FIG. 1C shows a horizontal section of a plan view of the example of the multi-LED system from FIG. 1A.

FIG. 1D shows a horizontal section of a perspective view of the example of the multi-LED system from FIG. 1A.

LIST OF REFERENCE SIGNS

Figure 1A:
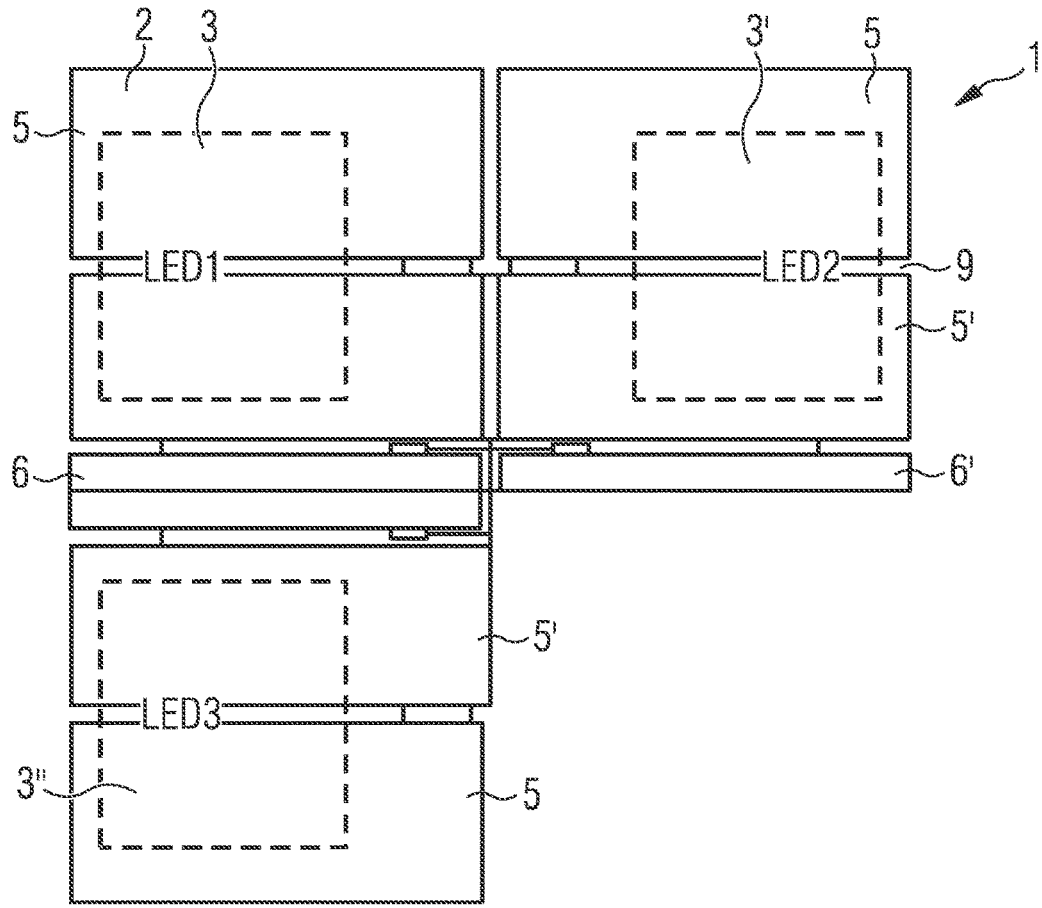
FIG. 1A shows a plan view of an example of a multi-LED system.

1 Multi-LED system
2 Carrier
3 LED
3' LED
3" LED
4 Main body
5 First upper metallization
5' First upper metallization
6 Second upper metallization
6' Second upper metallization
7 First lower metallization
7' First lower metallization
8 Second lower metallization
8' Second lower metallization
9 Gap
10 Gap
11 ESD protection component
11' ESD protection component
11" ESD protection component
12 Temperature sensor
13 First via
13' First via
14 Second via
14' Second via
15 Third via
15' Third via
16 Fourth via
16' Fourth via
17 Metallic structure
17' Metallic structure
17" Metallic structure
18 First via
18' First via

DETAILED DESCRIPTION

Our multi-LED system has a carrier on which a plurality of light-emitting diodes are arranged. The carrier has a main body in which a plurality of electrical components are embedded.

In particular, the multi-LED system is designed for use as a flash module in mobile applications. The multi-LED system may have exactly four light-emitting diodes. In particular, the flash module may be a quadruple LED flash module. The LEDs are arranged, for example, at the corner points of a rectangle, for example, a square.

By embedding the components in the carrier, it is possible to significantly reduce the size of the module or it is possible to integrate more LEDs in the same size module, as a result of which the flash power can be increased significantly. Integrating the components also prevents the light color and light intensity from changing in lateral irradiation due to reflection at the components. As a result, the light output and color quality of the photos in applications in mobile cameras can be improved significantly. For example, apart from the light-emitting diodes, no other electrical component is arranged on the carrier.

The embedded electrical components are, for example, one or more sensors and/or protection components. The components can comprise a ceramic material. For example, at least one ESD protection component is present to protect against electrostatic discharges (ESD). The at least one ESD protection component may be a varistor, in particular a multilayer varistor, or a TVS diode. As an alternative or in addition, a component for protection against overcurrents, for example, a PTC component, and/or a component for protection against increased temperatures, for example, an NTC component may be present.

The main body comprises, for example, a resin material and/or a polymer material. The resin material or polymer material may have fillers. By adding the fillers, the hardness, coefficient of thermal expansion and/or thermal conductivity of the main body can be influenced. For example, the coefficient of thermal expansion of the main body is adjusted to the coefficient of thermal expansion of the LEDs. For example, the main body comprises a glass fiber resin material. In addition or as an alternative to the glass fiber material, the resin material or polymer material may have ceramic fillers, for example.

The main body may be of multi-layered construction. All of the layers of the main body may comprise the resin material or polymer material. For example, the main body has an upper, middle and lower layer, wherein the middle layer is arranged between the upper and lower layer. The components may be embedded in the middle layer. In particular, the components may be arranged only in the middle layer and may be covered by the upper and lower layer.

The carrier may have a plurality of upper and lower metallizations applied to the top and the bottom side of the main body.

In particular, first upper metallizations may be applied to the top side of the main body for contact-connection of the LEDs. The LEDs are arranged, for example, on the first upper metallizations and secured to the first upper metallizations through soldering. For example, each LED connects to two first upper metallizations, wherein one of the metallizations is designed for the contact-connection of two LEDS. Therefore, two LEDs share one first upper metallization in each case. In a quadruple LED system, exactly six first upper metallizations are provided, for example.

One or more embedded components may also connect to the first upper metallizations. The embedded components connect to the first upper metallizations, for example, by vias. The embedded components may be one or more ESD protection components, for example.

Furthermore, second upper metallizations designed, for example, for the further contact-connection of one or more of the embedded components, may be arranged on the top side. In particular, a component is not arranged on the second upper metallizations. The embedded components connect to the metallizations, for example, by vias. The second upper metallizations are designed, for example, as conductor tracks. For example, two second upper metallizations in the form of an interrupted strip run from one edge of the multi-LED system to the opposite edge of the multi-LED system. The second upper metallizations are arranged, for example, between first upper metallizations.

The multi-LED system may have a temperature sensor electrically connected to the second upper metallizations. The temperature sensor is arranged, for example, in plan view in a central region of the multi-LED system.

Furthermore, lower metallizations for the electrical connection of the multi-LED system, in particular of the LEDs and/or of the embedded components, may be arranged on the bottom side of the main body.

For example, first lower metallizations for the electrical connection of the LEDs are arranged on the bottom side. For example, each LED connects to two first lower metallizations, wherein one of the metallizations may be designed for the contact-connection of all of the LEDs. In a quadruple LED system, exactly five first lower metallizations are present, for example.

The first lower metallizations electrically connect to the first upper metallizations, for example, by first vias. The vias may be, in particular, thermal vias distinguished by a high thermal conductivity. The first vias extend from the first upper metallization to the first lower metallization, for example, without interruption.

Furthermore, second lower metallizations may be arranged on the bottom side, which second lower metallizations are designed, for example, for electrical connection of one or more of the embedded components. For example, the second lower metallizations are arranged only in lateral edge regions on the bottom side of the carrier. A first lower metallization is arranged, for example, between the second lower metallizations.

The second lower metallizations connect, for example, to the second upper metallizations by fourth vias. For example, the fourth vias lead from the second upper metallizations to the second lower metallizations. In particular, the fourth vias may lead from the second upper metallizations to the second lower metallizations without interruption.

The second lower metallizations may be designed for the electrical connection of a temperature sensor.

At least one of the embedded components may connect to at least one of the upper metallizations by a via and the upper metallization may connect to a lower metallization by a via. In particular, the embedded component may connect to two upper metallizations by a respective via and the two upper metallizations may connect to two lower metallizations by a respective via. The embedded component connects to lower metallizations, in particular, only by the upper metallizations and does not have a direct connection to the lower metallizations. A connection structure of this kind makes it possible to connect the embedded component from the bottom side in an efficient and space-saving manner.

One or more metallic structures may be embedded in the main body for reduction of thermal resistance. For example, the metallic structures are metal blocks or metal strips. The metallic structures comprise copper, for example. The vias may be interrupted by the metallic structures or may pass through the metallic structures.

We also provide an LED system. In contrast to the multi-LED system described above, the LED system may also have only one single light-emitting diode. There may also be only one single embedded component present. As an alternative thereto, the LED system has a plurality of light-emitting diodes and/or a plurality of embedded components. All of the properties described above in relation to the multi-LED system may—as far as it makes sense—also be present in the LED system.

In particular, the carrier may have at least one upper metallization for the connection of at least one of the embedded components and at least one lower metallization for the connection of the embedded component, wherein the embedded component connects to the upper metallization by a via and wherein the upper metallization connects to the lower metallization by a via. In particular, the embedded component may connect to two upper metallizations by two vias and the two upper metallizations may connect to two lower metallizations by two vias.

We further provide a carrier for a multi-LED system. The carrier may be designed as described above. The carrier has a main body in which a plurality of electrical components are embedded. The carrier is designed for arrangement of a plurality of LEDs. In particular, a plurality of ESD protection components and at least one temperature sensor are embedded in the main body. The main body comprises a resin material or polymer material, for example.

All of the properties described in relation to the multi-LED system, the carrier and the LED system are disclosed in relation to the other examples, even if the respective property is not explicitly mentioned in the context of the other examples. Furthermore, this description is not limited to the individual specific examples. Rather, the features of individual examples—insofar as it makes technical sense—can be combined with one another.

The subject matter described here is explained in more detail in the following text with reference to schematic examples.

In the following figures, parts of the various examples corresponding in terms of function or structure are preferably denoted by the same reference signs.

Figure 1B:
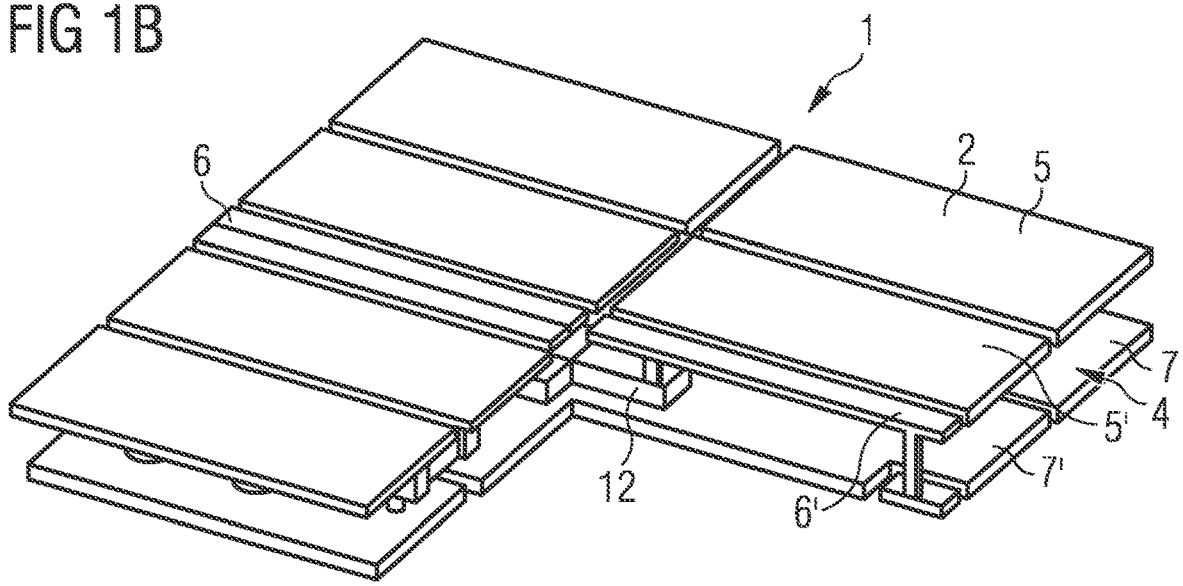
FIG. 1B shows a perspective view of the example of the multi-LED system from FIG. 1A.

FIG. 1A shows a plan view of a multi-LED system 1. FIG. 1B shows a perspective view of the multi-LED system 1.

The multi-LED system 1 has a carrier 2 on which a plurality of light-emitting diodes 3, 3', 3" are arranged. For reasons of better illustration, the right lower quarter of the system 1 is not shown. The quarter is designed, for example, in a manner axially mirrored with respect to the left bottom quarter.

The light-emitting diodes 3, 3', 3" are indicated by dashed borders. The light-emitting diodes 3, 3', 3" may be covered by optical structures, for example, lenses and/or light-conversion layers, and/or protection structures. The multi-LED system 1 has, for example, exactly four light-emitting diodes.

The multi-LED system 1 is used, for example, to generate a flash. In one example, the LED system 1 has no further discrete components on the carrier 2 except for the LEDS 3, 3', 3". This makes it possible to miniaturize the LED system 1 particularly well. In addition, the light output and homogeneity of the irradiated light can be improved as a result thereof. In particular, shading and changes of color due to further surface-mounted components do not occur.

The carrier 2 has a main body 4 (FIG. 1B), illustrated as transparent for reasons of illustration. The main body 4 may be of multi-layered, for example, three-layered, construction. The main body 4 comprises, for example, a resin material, in particular a glass fiber resin material. In addition or as an alternative to the glass fiber material, the resin material may comprise ceramic fillers. The main body 4 may also comprise a polymer material, in particular a filled polymer material.

In general, the main body 4 may comprise at least one material from a group consisting of resin, in particular bismaleimide-triazine resin, polymers, glass, in particular glass fibers, prepreg material, polyimide, a liquid-crystal polymer, cyanate esters, epoxy-based build-up film, FR4 material, a ceramic and a metal oxide. In this case, the main body 4 may contain further fillers in addition to a base material such as, for example, resin or a polymer. FR4 refers to a class of composite materials consisting of epoxy resin and glass fiber fabrics. Resin-glass fiber laminates are distinguished by a high dielectric strength and mechanical strength.

Furthermore, the material of the main body 4 may be selected such that soldering processes at relatively high temperatures are made possible. For example, the LEDs 3, 3', 3" are soldered to the carrier 2. The material of the main body 4 is suitable, in particular, for soldering processes at 320° C., which occur, for example, in reflow soldering using a gold-tin soldering paste. The gold-tin soldering paste comprises, for example, 80% gold and 20% tin. As an alternative, for example, an SnAgCu soldering paste may also be used, which is soldered at temperatures around 260° C.

A plurality of upper metallizations 5, 5', 6, 6' are arranged on a top side of the main body 4. A plurality of lower metallizations 7, 7', 8, 8' are arranged on a bottom side of the main body 4 (FIG. 1C). The upper metallizations 5, 5', 6, 6' are separated from one another by a gap 9. The lower metallizations 7, 7', 8, 8' are separated from one another by a gap 10.

First upper metallizations 5, 5' are designed, for example, as contact faces for the contact-connection of the LEDs 3, 3', 3". Second upper metallizations 6, 6' are designed as further contact-connection of an embedded component 12. The lower metallizations 7, 7' are designed as connection faces for the electrical connection of the multi-LED system, in particular of the LEDs 3, 3', 3" and of the embedded components.

In FIGS. 1A and 1B, the local thermal resistance determined through thermal simulation is shown in K/W in a range of 1 K/W to 12 K/W. It can be seen here that the thermal resistance is greatest close to a gap 9 between the first upper metallizations 5, 5'.

FIG. 1C shows a horizontal section of a plan view of the multi-LED system 1 of FIGS. 1A and 1B. FIG. 1D shows a horizontal section of a perspective view of the multi-LED system 1.

A plurality of electrical components 11, 11', 11", 12 are embedded in the main body 4, in particular in a middle layer of the main body 4. The components 11, 11', 11", 12 are fully embedded in the carrier 2. For example, the components 11, 11', 11", 12 are fully embedded in the middle layer of the main body 4 and are arranged between the upper and lower layer of the main body 4.

The electrical components 11, 11', 11", 12 are formed, in particular, in an ultrathin manner. The installation height in this case may be, for example, less than or equal to 0.33 mm.

In the present example, a plurality of ESD protection components 11, 11', 11" and a temperature sensor 12 are embedded in the carrier 2.

In particular, exactly one ESD protection component 11, 11', 11" is present for each LED 3, 3', 3". In this case, in plan view, two respective ESD protection components 11, 11', 11" are arranged between two adjacent LEDs 3, 3', 3".

The ESD protection components 11, 11', 11" comprise, for example, a ceramic. The ceramic may be, in particular, a varistor ceramic, for example, doped ZnO, $SrTiO_2$ or SiC.

The temperature sensor 12 is designed as an NTC component. For example, the temperature sensor 12 comprises a ceramic. The temperature sensor 12 is arranged, in plan view, in the center of the multi-LED system 1.

The LEDs 3, 3', 3" are arranged on the first upper metallizations 5, 5' and electrically connect thereto. The first upper metallizations 5, 5' connect to the first lower metallizations 7, 7' by first vias 13, 13'. In this case, four first vias 13, 13' are present for each LED 3, 3', 3". The first vias 13, 13' extend from the first upper metallizations 5, 5' to the first lower metallizations 7, 7' without interruption. In each case, two of the LEDs 3, 3', 3" share one first upper metallization 5'. In the example shown, exactly six first upper metallizations 5, 5' are present. All of the LEDs 3, 3', 3" share one first lower metallization 7'. In the example shown, exactly five first lower metallizations 7, 7' are present.

The first vias 13, 13' have, for example, diameters of 100 to 200 μm, preferably 130 to 170 μm. In particular, the diameters can be 150 μm. The first vias 13, 13' are designed, for example, as thermal vias, which reduce the thermal resistance of the carrier 2. The vias 13, 13' comprise copper, for example. The vias 13, 13' are, in particular, fully filled thermal copper vias.

The varistors 11, 11', 11" connect to the first upper and first lower metallizations 5, 5', 7, 7' by second vias 14, 14' (FIG. 1D). In this case, the vias 14, 14' each extend from a varistor 11, 11', 11" up to the first upper metallizations 5, 5' or from a varistor 11, 11', 11" to the first lower metallizations 7, 7'.

The temperature sensor 12 connects to the second upper metallizations 6, 6' by third vias 15, 15'. The third vias 15, 15' extend from a top side of the temperature sensor 12 up to the second upper metallizations 6, 6'.

The second upper metallizations 6, 6' connect to the second lower metallizations 8, 8' by fourth vias 16, 16'. The fourth vias 16, 16' extend from the second upper metallizations 6, 6' up to the second lower metallizations 8, 8'. The fourth vias 16, 16' are arranged, in plan view, in an edge region of the carrier 2.

The second upper metallizations 6, 6' run from one edge of the carrier 2 to the opposite edge of the carrier 2 as a strip interrupted by a gap. The second lower metallizations 8, 8' are each arranged only in an edge region of the carrier 2. A first lower metallization 7' is arranged between the second lower metallizations 8, 8'.

The second, third and fourth vias 14, 14', 15, 15', 16, 16' comprise copper or silver, for example. The second, third and fourth vias 14, 14', 15, 15', 16, 16' may have a smaller diameter than the first vias 13, 13', for example, diameters of 40 to 100 μm, in particular 40 to 70 μm.

The LED system 1 has, for example, dimensions of 2.6×2.6 mm². The thickness of the LED system 1 is, for example, 300 μm, without LEDs. The varistors 11, 11', 11" and the temperature sensor 12 each have, for example, a thickness of 100 μm.

Figure 2A:
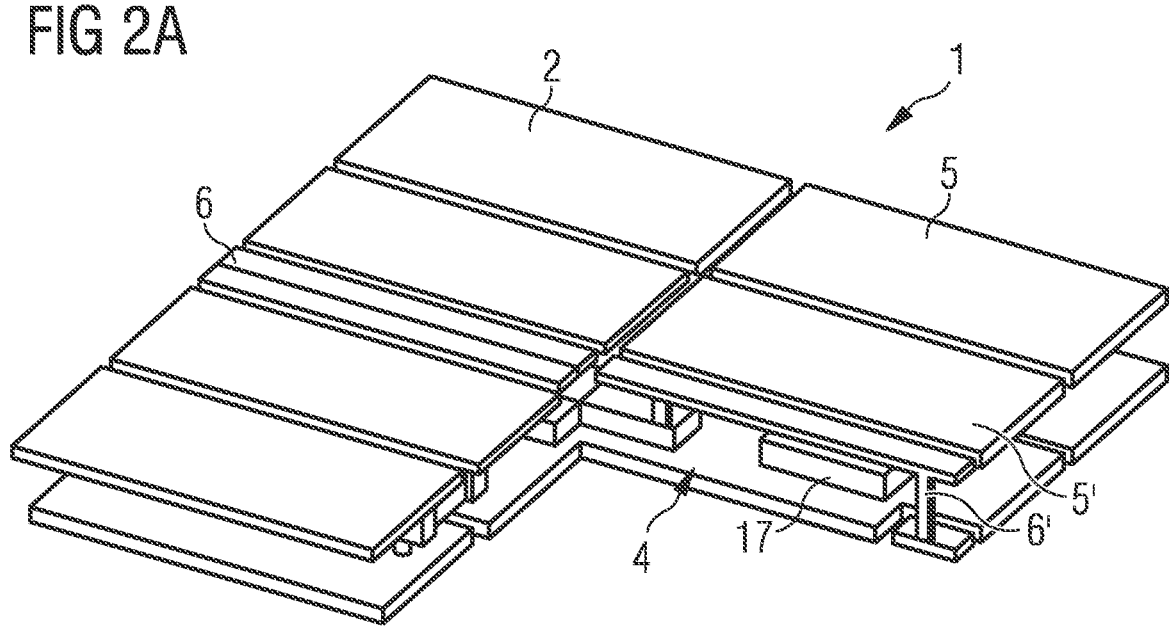
FIG. 2A shows a perspective view of a further example of a multi-LED system.
Figure 2B:
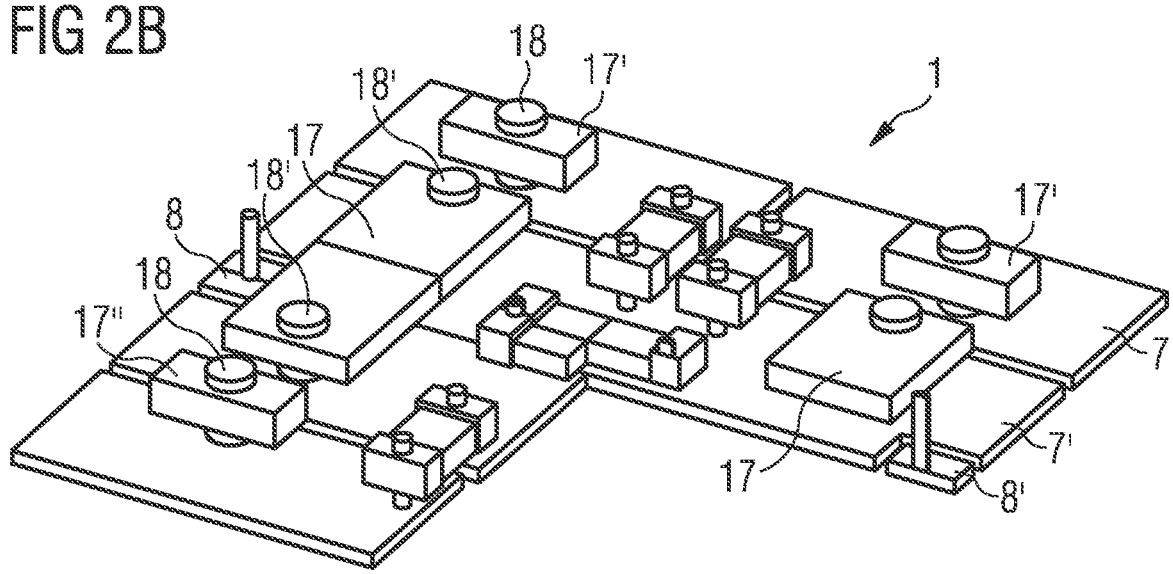
FIG. 2B shows a horizontal section of a perspective view of the example of the multi-LED system from FIG. 2A.

FIGS. 2A and 2B show a perspective view and a horizontal section of a perspective view of a further example of a multi-LED system 1.

In contrast to the example from FIGS. 1A to 1D, metallic structures 17, 17', 17" are embedded in the carrier 2 for the reduction of the thermal resistance. The metallic structures 17, 17', 17" are designed in the form of blocks or strips. The metallic structures 17, 17' comprise copper, for example.

The metallic structures 17, 17', 17" are embedded, for example, in a middle layer of the main body 4. In particular, the metallic structures 17, 17', 17" do not pass through the upper and lower layer of the main body 4. The metallic structures 17, 17', 17" connect to the first upper and first lower metallizations 5, 5', 7, 7' by first vias 18, 18'. The vias 18, 18' may pass through the metallic structures 17, 17', 17" or be interrupted by the metallic structures 17, 17', 17". The vias 18, 18' may also be formed in one piece with the metallic structures 17, 17', 17".

The first vias 18, 18' are designed in a corresponding manner to the first vias 13, 13' of the example in FIGS. 1A to 1D. In contrast thereto, however, in this case, for each LED 3, 3', 3", only two vias 18, 18' lead away from the first upper metallizations 5, 5'. Each via 18, 18' connects to an embedded metallic structure 17, 17', 17". In this case, two vias 18' share one metallic structure 17. In the example shown, six metallic structures 17, 17', 17" are present overall.

As an alternative, the LED system may also have just one single LED. In this case, the contact-connection of the LED and the contact-connection of one or more embedded components may be formed, in particular, in a manner corresponding to the examples of FIGS. 1A to 2B.

The invention claimed is:

1. A multi-LED system comprising:
a carrier; and
a plurality of light-emitting diodes arranged on the carrier,
wherein the carrier has a main body, and a plurality of electrical components are embedded in the main body,
the carrier has upper metallizations arranged on a top side of the main body,
the upper metallizations comprising first upper metallizations for contact-connection of the LEDs and second upper metallizations for further contact-connection of the same one of the embedded components,
the second upper metallizations are separate from the first upper metallizations, the carrier has lower metallizations arranged on a bottom side of the main body,
the second upper metallizations connect to the lower metallizations by vias, wherein the vias are laterally offset from the embedded component that is connected to the second upper metallizations,
the second upper metallizations are not connected to any of the LEDs, and
the embedded component is only connected to the lower metallizations by the upper metallizations and the vias from the upper to the lower metallizations.

2. The multi-LED system according to claim 1, wherein the embedded component connects to the upper metallizations by vias.

3. The multi-LED system according to claim 1, wherein the main body comprises a resin material and/or polymer material.

4. The multi-LED system according to claim 1, wherein at least one metallic structure in the form of a block or strip is arranged in the main body for reduction of the thermal resistance.

5. The multi-LED system of claim 4, wherein the block or strip is not provided for contact-connecting an embedded component.

6. The multi-LED system according to claim 4, wherein a first LED connects to a first via and a second LED connects to a second via, and the vias share a metallic structure.

7. The multi-LED system according to claim 1, having exactly four light-emitting diodes.

8. The multi-LED system according to claim 1, wherein the embedded electrical components comprise at least one temperature sensor.

9. The multi-LED system according to claim 1, wherein the embedded electrical components comprise at least one ESD protection component.

10. The multi-LED system according to claim 8, comprising a plurality of ESD protection components and a temperature sensor, wherein, in plan view, the temperature sensor is arranged in a central region of the multi-LED system and the ESD protection components are located between adjacent light-emitting diodes.

11. The multi-LED system according to claim 1, wherein the second upper metallizations run in a strip between the first upper metallizations.

12. The multi-LED system according to claim 1, wherein the second upper metallizations are designed for the further contact-connection of a temperature sensor.

13. The multi-LED system according to claim 1, further comprising lower metallizations arranged on a bottom side of the main body, wherein the lower metallizations comprise first lower metallizations for connection of the LEDs and second lower metallizations for connection of an embedded component.

14. The multi-LED system according to claim 13, wherein the second lower metallizations are arranged only in lateral edge regions on the bottom side of the carrier.

15. The multi-LED system according to claim 14, wherein the embedded component is arranged, in plan view, in a central region of the multi-LED system.

16. The multi-LED system according to claim 1, further comprising an embedded component connected to the second upper metallizations by second vias wherein the second upper metallizations connect to the second lower metallizations by fourth vias.

17. A carrier for a multi-LED system comprising:
a carrier designed for arrangement of a plurality of LEDs and having a main body having a resin material and/or polymer material,
wherein a plurality of ESD protection components and at least one temperature sensor are embedded in the main body,
the carrier has upper metallizations arranged on a top side of the main body,
the upper metallizations comprising first upper metallizations for contact-connection of the plurality of LEDs and second upper metallizations for further contact-connection of the same one of a plurality of embedded components in the main body,
the second upper metallizations are separate from the first upper metallizations,
the carrier has lower metallizations arranged on a bottom side of the main body,
the second upper metallizations connect to the lower metallizations by vias, wherein the vias are laterally offset from the embedded component that is connected to the second upper metallizations,
the second upper metallizations are not connected to any of the LEDs, and
the embedded component is only connected to the lower metallizations by the upper metallizations and the vias from the upper to the lower metallizations.

18. An LED system comprising:
a carrier; and one or more light-emitting diodes arranged on the carrier,
wherein the carrier has a main body,
one or more electrical components are embedded in the main body,
the carrier has upper metallizations, the upper metallizations comprising at least one first upper metallization for the connection of at least one of the one or more light-emitting diodes and at least one second upper metallization for the connection of at least one of the embedded components,
the upper metallizations are arranged on a top side and the lower metallization is arranged on a bottom side of the main body,
the embedded component connects to the second upper metallization by a first via,
the second upper metallization connects to the lower metallization by a second via, the second via being laterally offset from the embedded component,
the second upper metallization is separate from the first upper metallization,
the second upper metallization is not connected to any of the light-emitting diodes, and
the embedded component is only connected to the lower metallization by the upper metallizations and the vias from the upper to the lower metallization.

* * * * *